(12) United States Patent
Leung et al.

(10) Patent No.: US 7,113,011 B2
(45) Date of Patent: Sep. 26, 2006

(54) LOW POWER PLL FOR PWM SWITCHING DIGITAL CONTROL POWER SUPPLY

(75) Inventors: Ka Y. Leung, Austin, TX (US); Kafai Leung, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/872,702

(22) Filed: Jun. 21, 2004

(65) Prior Publication Data

US 2005/0280458 A1 Dec. 22, 2005

(51) Int. Cl.
*H03L 7/06* (2006.01)
(52) U.S. Cl. ....................... 327/149; 327/158
(58) Field of Classification Search ................ 327/149, 327/151, 158, 161, 172; 331/1 A, 17, 25, 331/DIG. 2; 375/373, 375, 376
See application file for complete search history.

(56) References Cited

U.S. PATENT DOCUMENTS 5,889,436 A * 3/1999 Yeung et al. .................. 331/2
6,642,758 B1 * 11/2003 Wang et al. ................. 327/156

* cited by examiner

*Primary Examiner*—Linh My Nguyen
(74) *Attorney, Agent, or Firm*—Howison & Arnott, LLP

(57) ABSTRACT

A timing source for a pulse generator is disclosed, which timing source includes an input for receiving a reference clock output at a reference operating frequency. An edge generator is provided for generating a plurality of clock edges from an edge of the reference clock during one period thereof, with the spacing of the plurality of clock edges being a multiple of a predetermined divisor. As such, the resolution of such spacing emulates a higher clock frequency than the reference operating frequency. A selector then selects one of the plurality of clock edges from a reference one thereof to define the width of a pulse.

22 Claims, 7 Drawing Sheets

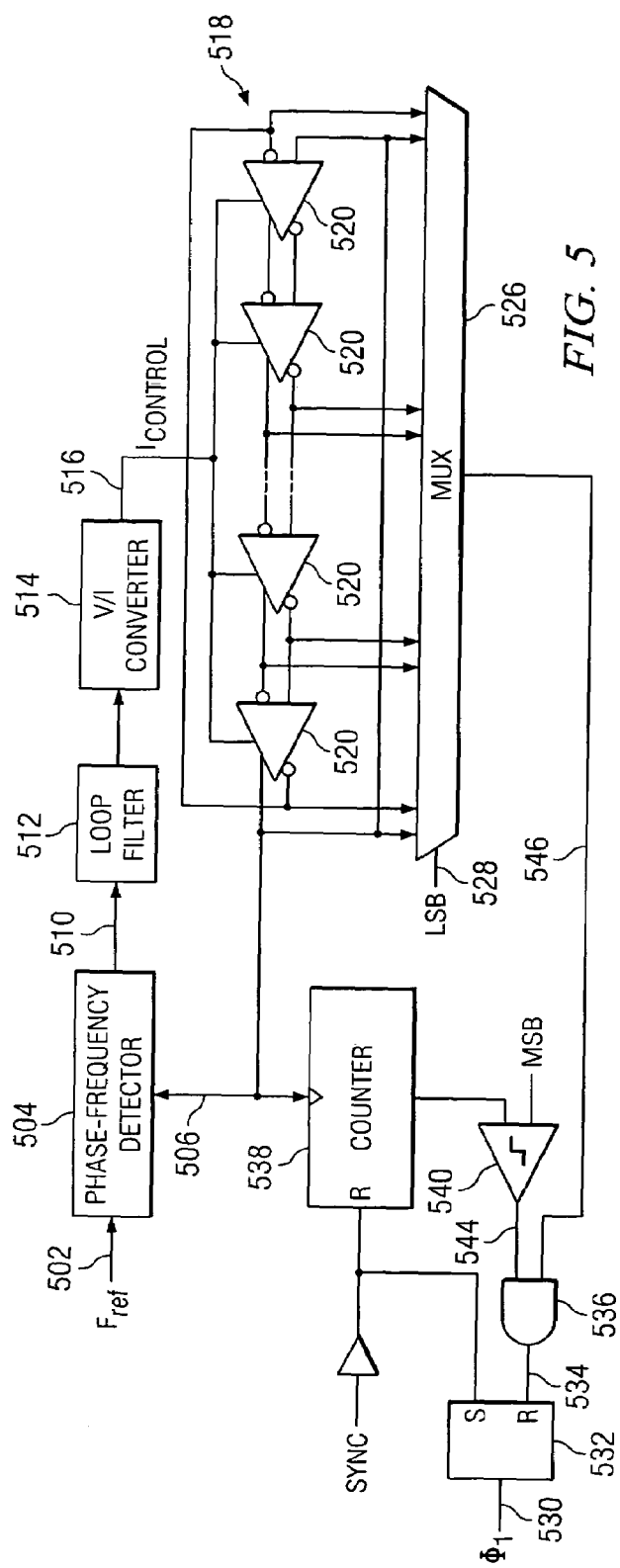
FIG. 5
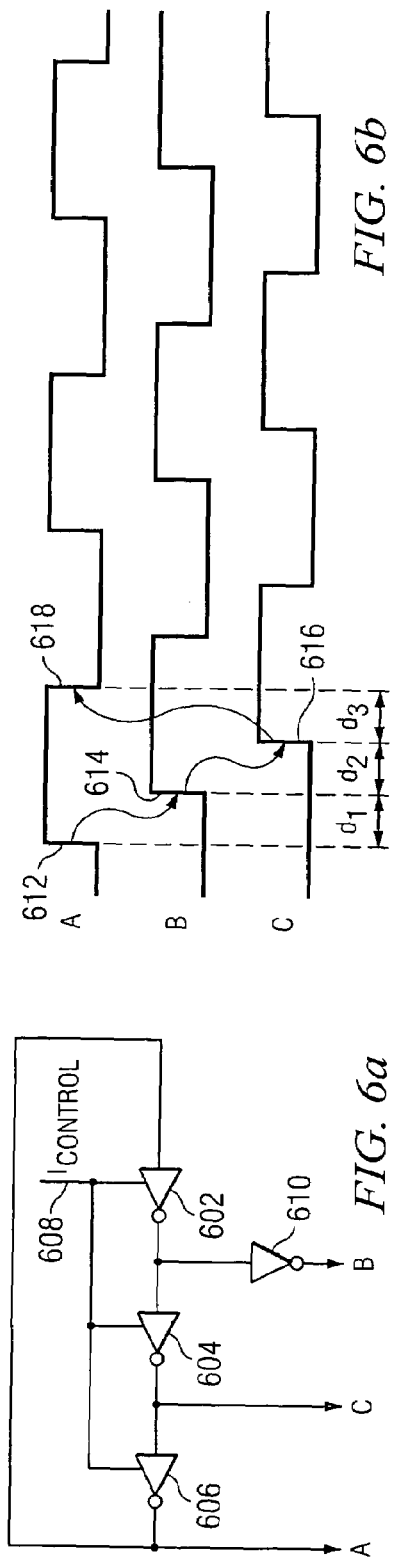
FIG. 6a
FIG. 6b

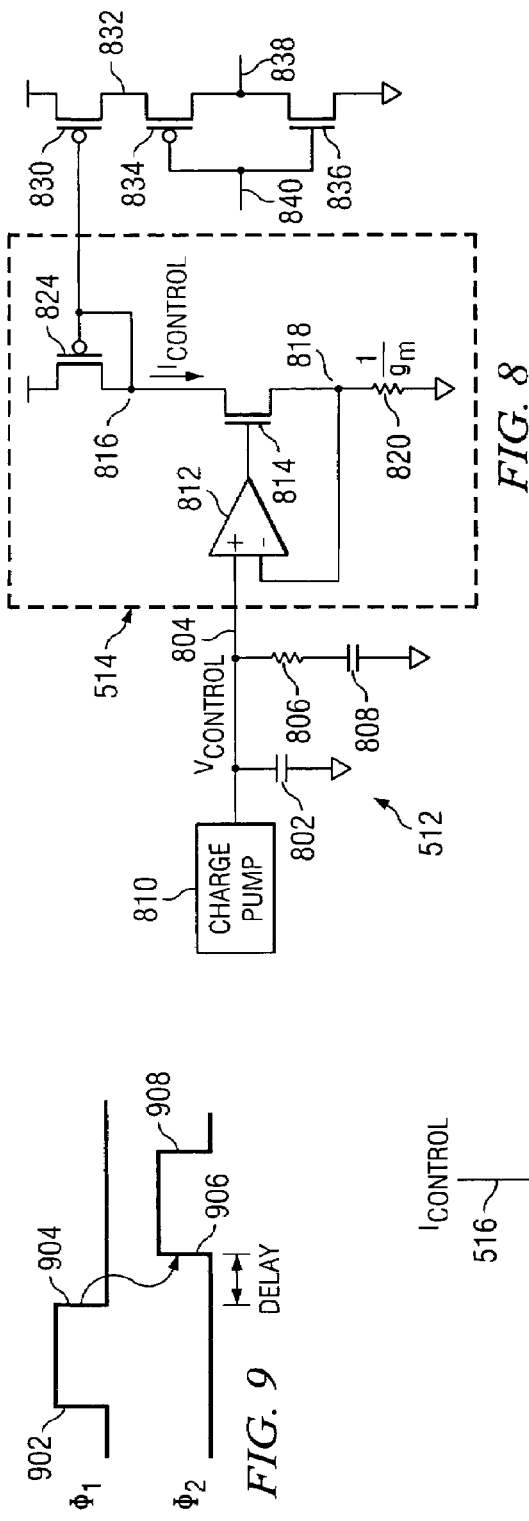
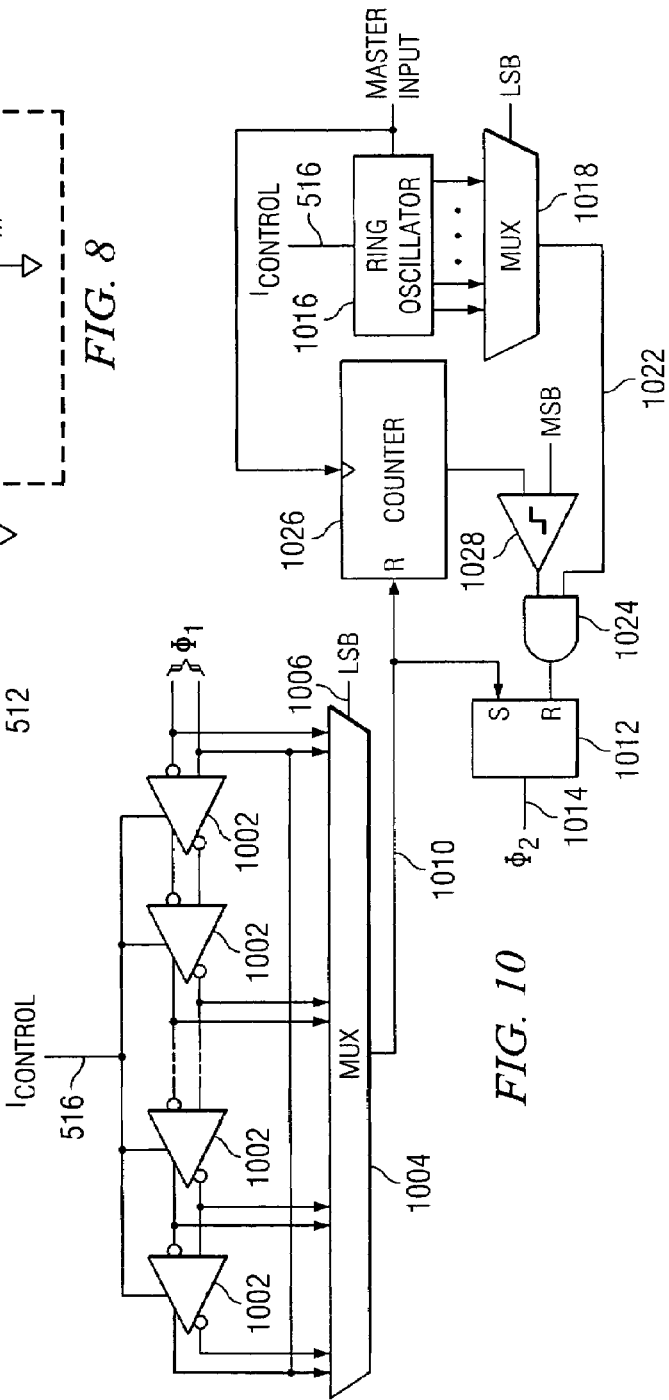
FIG. 8
FIG. 9
FIG. 10

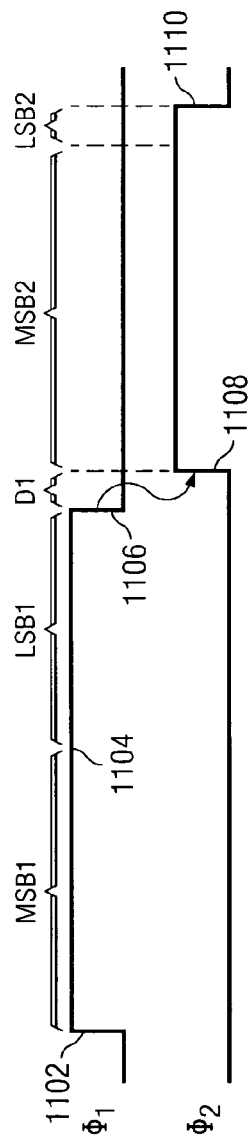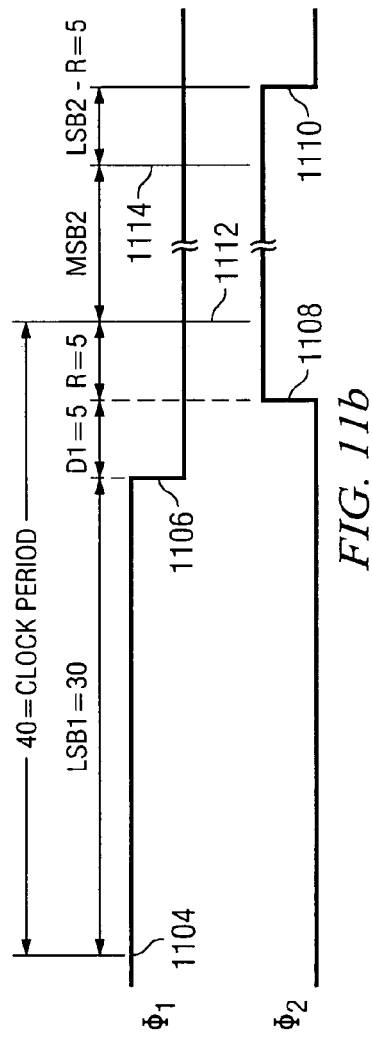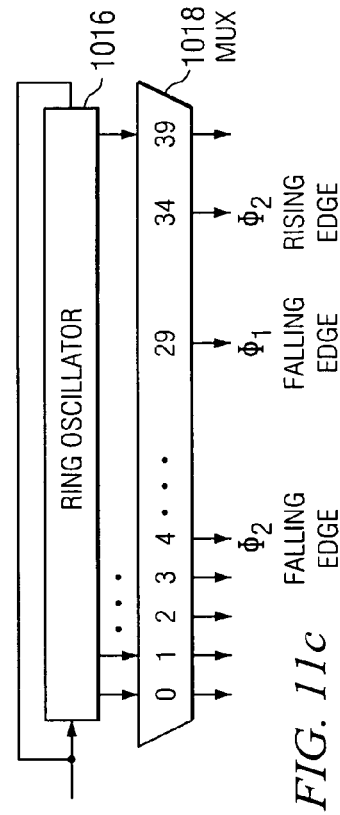

LOW POWER PLL FOR PWM SWITCHING DIGITAL CONTROL POWER SUPPLY

CROSS-REFERENCE TO RELATED APPLICATIONS

This application is related to pending U.S. patent application Ser. No. 10/742,509, filed Dec. 19, 2003, entitled "DIGITAL CONTROL CIRCUIT FOR SWITCHING POWER SUPPLY WITH PATTERN GENERATOR", which is incorporated in its entirety herein by reference.

TECHNICAL FIELD OF THE INVENTION

The present invention pertains in general to switching power supplies and, more particularly, to the timing system for generating pulses that drive the switching elements in the power supply.

BACKGROUND OF THE INVENTION

Switching power supplies utilize a plurality of switches which are turned on and off to switch an input DC voltage at a first level across a transformer to a load, the output voltage disposed at a different and lower DC voltage level than the input DC voltage. For some power supply applications, the initial input DC voltage may be at a high level of, for example, 75 volts. This voltage then must be reduced to a fairly low voltage, on the order of less than 3 volts, with future voltages going as low as 1 volt. Large differences between input and output voltage levels will result in very short pulse width switching pulses that switch the transistors in the switching power supply relative to the overall period of the switching operation. Since jitter or ripple on the output voltage is a function of how well the pulse width is controlled, it is important that the resolution of the falling edge of the pulse, i.e., the edge that defines the width of the pulse, be tightly controlled. This resolution is defined as a percentage of the entire pulse width. Typically, the pulse width is generated with some type of counter that requires a time base which is utilized to define the trailing edge of the pulse. In order to maintain very low ripple, a very tightly controlled pulse width will be required. This can result in the requirement for a fairly high clock frequency that is output by a clock generator. For example, if a resolution of approximately 40 nanoseconds is required for the definition of the pulse width, then a 24 MHz clock would suffice. This will allow the falling edge of a pulse to be defined within +/−40 nanoseconds. However, for a power supply that steps down from 75 volts to 3 volts or even 1 volt, this would result in a considerable amount of ripple. To increase the resolution, it may be that a resolution on the order of 1 nanosecond is required. This will require a clock up in the 1 GHz range. The problem with such clocks is they tend to be complex, as they must be accurate clocks, and they also draw considerable power. Thus, it would be desirable to have less complexity associated with a lower speed clock, but gain the resolution of a higher speed clock.

SUMMARY OF THE INVENTION

The present invention disclosed and claimed herein comprises, in one aspect thereof a timing source for a pulse generator. The timing source includes an input for receiving a reference clock output at a reference operating frequency. An edge generator is provided for generating a plurality of clock edges from an edge of the reference clock during one period thereof, with the spacing of the plurality of clock edges being a multiple of a predetermined divisor. As such, the resolution of such spacing emulates a higher clock frequency than the reference operating frequency. A selector then selects one of the plurality of clock edges from a reference one thereof to define the width of a pulse.

BRIEF DESCRIPTION OF THE DRAWINGS

For a more complete understanding of the present invention and the advantages thereof, reference is now made to the following description taken in conjunction with the accompanying Drawings in which:

FIG. 5 illustrates a block diagram of a portion of the digital pulse width modulator for generating the first phase, φ1;

FIGS. 6a and 6b illustrate a simplified diagrammatic view of the ring oscillator and associated timing diagrams illustrating the delay;

FIG. 8 illustrates a diagrammatic view of the state machine for generating both the delay prior to the rising edge of a subsequent pulse and the pulse width thereof; and FIG. 9 illustrates a block diagram of the overall state machine FIG. 10 illustrates a block diagram of the state machine for generating a delayed pulse;

FIGS. 11a–11c illustrate diagrams as to how both the delay between two successive pulses and the pulse width of the subsequent delayed pulse are defined.

DETAILED DESCRIPTION OF THE INVENTION

Figure 1:
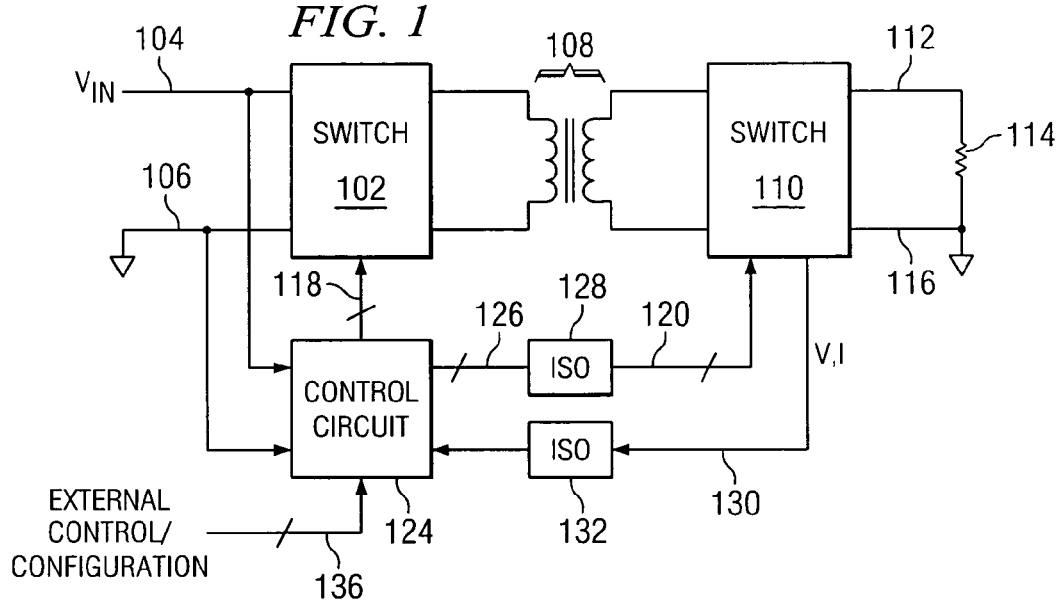
FIG. 1 illustrates an overall block diagram of a switching power supply utilizing the digital control circuit of the present disclosure.

Referring now to FIG. 1, there is illustrated a top level schematic diagram for the switching power supply of the present embodiment. The main portion of the power supply comprises a primary switch group 102 that is operable to receive an input voltage on a node 104, this being a DC voltage, and ground on a node 106. The primary switch group 102 is coupled through an isolation transformer 108 to a secondary switch group 110. The secondary switch group 110 is operable to drive an output voltage node 112 that is connected to one terminal of a load 114, the secondary switch group 110 also having a ground connection on a node 116, the load 114 disposed between the node 112 and the node 116. The two switch groups 102 and 110 are operable to operate in conjunction with various pulse inputs on a control bus 118 associated with the primary switch group 102 and with various pulse inputs on a control bus 126 associated with the secondary switch group 110.

A digital control circuit 124 is provided which is operable to control the operation of the primary switch group 102 and the secondary switch group 110. The nodes 104 and 106 are provided as inputs to the digital control circuit 124 for sensing the voltage and current on the primary, the digital control circuit 124 generating the information on the bus 118 for control of the primary switch group 102. The control circuit 124 must be isolated from the secondary switch group 110. This is facilitated by driving a bus 126 through an isolation circuit 128, such as an opto-isolator, to drive the bus 120. Similarly, the control circuit 124 is operable to sense the voltage and current levels on the output node 112 through sense lines 130 which are also connected through an isolation circuit 132 to the digital control circuit 124. The digital control circuit 124 is also interfaced to a bus 136 to receive external control/configuration information. This can be facilitated with a serial data bus such as an SMB serial data bus.

Figure 2:
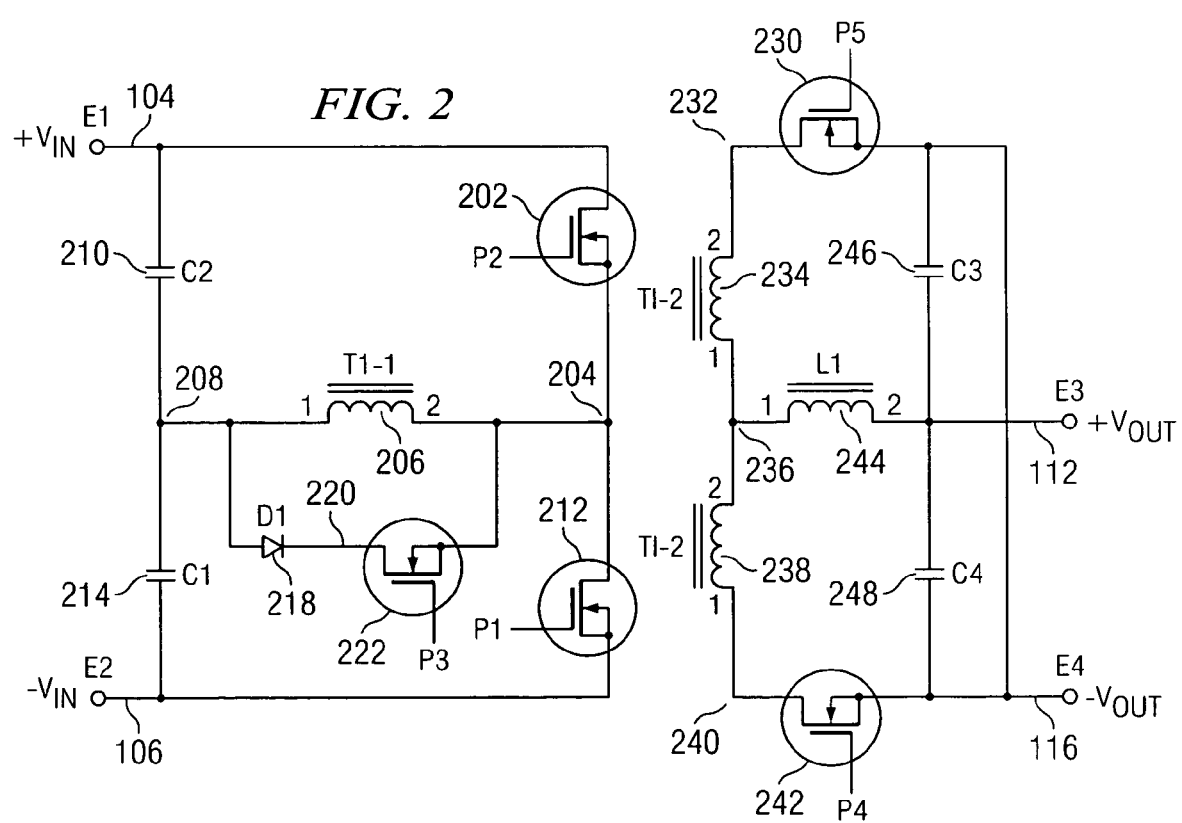
FIG. 2 illustrates a schematic diagram of the switching portion of a half-bridge power supply.

Referring now to FIG. 2, there is illustrated a detailed schematic diagram of the primary switch group 102, isolation transformer 108 and secondary switch group 110. The node 104 is connected to one side of the source-drain path of a power switching transistor 202, the other side thereof connected to a node 204. Node 204 is connected to one side of the primary of isolation transformer 108, a primary 206. The other side of primary 206 is connected to a node 208. Node 208 is coupled to node 104 through a capacitor 210. Node 106 is coupled to one side of the source-drain path of a switching transistor 212, the other side thereof connected to node 204. Node 208 is coupled through a capacitor 214 to node 106. A diode 218 has the anode thereof connected to node 208 and the cathode thereof connected to a node 220, node 220 connected to one side of the source-drain path of a switching transistor 222, the other side thereof connected to node 204.

Switching transistor 212 is controlled by a switching pulse P1, the gate of switching transistor 202 controlled by a switching pulse P2 and the gate of switching transistor 222 controlled by switching pulse P3. Switching pulses P1, P2 and P3 all form part of the bus 118.

The secondary switch group 110 is comprised of a switching transistor 230 having the source-drain path thereof connected between the node 116 and a node 232, the gate thereof controlled by a switching pulse P5. Node 232 is connected to one side of a winding 234 which forms part of the secondary of the isolation transformer 108. The other side of winding 234 is connected to a center tap node 236, node 236 connected to one side of a winding 238, the other side thereof connected to a node 240. Winding 238 and winding 234 form the secondary of transformer 108.

Node 240 is connected to one side of the source-drain path of a switching transistor 242, the other side thereof connected to node 116 and the gate thereof connected to a switching pulse P4. An inductor 244 is connected between node 236 and the output node 112. The output node 112 is coupled to the ground node 116 through a capacitor 246 which is connected proximate to the other side of the source-drain path of transistor 230 and coupled through a capacitor 248 to node 116 proximate to the other side of the source-drain path of switching transistor 242.

Figure 3:
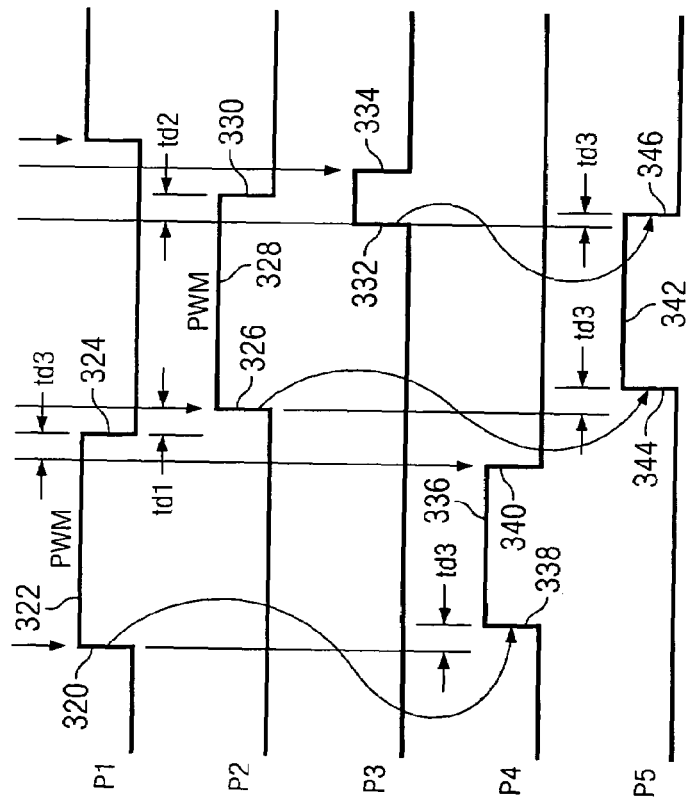
FIG. 3 illustrates the timing diagram for the control pulses to the switching power supply.

Referring now to FIG. 3, there is illustrated a timing diagram for generating the switching pulses to operate the switch of FIG. 2. The switching pulse P1 is a pulse-width modulated switching pulse having a rising edge 320. The rising edge 320 changes the level to a high level 322 which then returns to the low level at a falling edge 324. The switching pulse P2 is delayed from the falling edge 324 by a delay $t_{d1}$. The rising edge 326 changes the level of switching pulse P2 to a high level 328 followed by a change back to a low level having a falling edge 330. The switching pulse P3 goes from a low level to a high level ahead of the falling edge of P1 by delay time $t_{d2}$. The switching pulse P3 goes low ahead of the falling edge of P2 by delay time $t_{d3}$.

In the output switch, the switching pulse P4 goes from a low level to a high level 336 at a rising edge 338. The rising edge 338 is delayed from the rising edge 320 by a delay $t_{d3}$. The switching pulse P4 returns to a low level ahead of the falling edge P2 by delay time $t_{d3}$. The switching pulse P5 goes from a low level to a high level 342 at a rising edge 344 which is delayed from edge 326 of switching pulse P2 by a delay $t_{d3}$. Switching pulse P5 returns to a low level ahead of the rising edge of P3 by delay $t_{d3}$.

It can be seen that the switches 202 and 212 in FIG. 2 are controlled by switching pulses P1 and P2. The delay $t_{d1}$ is the duration of time required for transistor 212 to go from a conducting state to a non-conducting state and prior to transistor 202 going to a conducting state. The delay $t_{d1}$ is a delay that is required in order to ensure that the switches are completely off such that connecting the node 204 to the ground node 106 does not cause current to flow through transistor 202. This could result in a "shoot-through" current spike. Depending upon the circuit components and operating frequency, it may be necessary to vary this delay. Similarly, transistor 222 will be turned on prior to turning off switch 202 with the delay $t_{d2}$ allowing the diode 218 to be placed in parallel with the primary 206 prior to turning off transistor 202. Similarly, on the output switch, it is necessary that transistor 242 is maintained in a non-conducting state until transistor 322 is fully turned on and node 204 is sufficiently grounded. Further, it is necessary that the falling edge 346 be delayed until the transistor 222 has fully turned on, which requires the delay $t_{d3}$. This timing is conventional and, depending upon the application, the various delays will be adjusted, these adjustments due to the size of the load, circuit characteristics and operating frequency.

Figure 4:
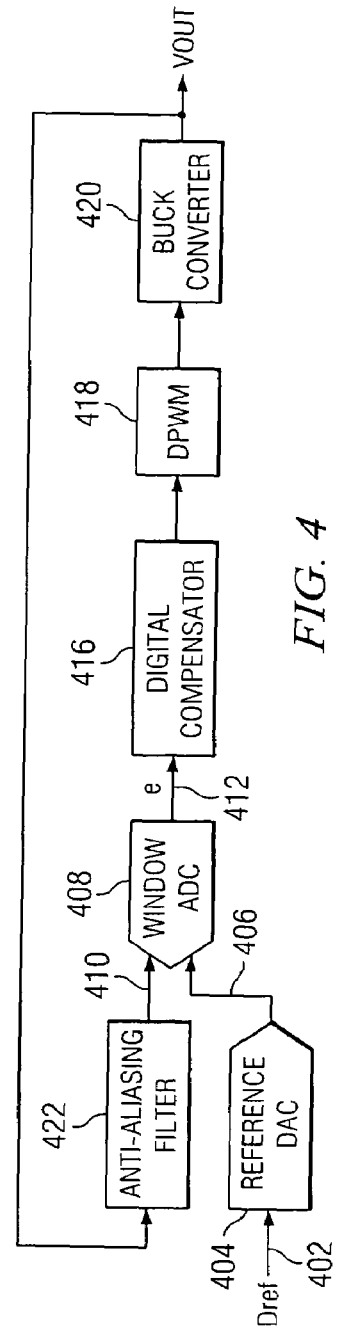
FIG. 4 illustrates an overall flow diagram for the digital switching power supply.

Referring now to FIG. 4, there is illustrated an overall flow diagram for the digital controller architecture. A digital reference voltage is provided on a digital input 402 which is input to a reference digital-to-analog converter (DAC) 404. This provides an analog output reference voltage on an analog line 406. This is input to one input of a window analog-to-digital converter (ADC) 408. The window ADC 408 is operable to receive a feedback analog signal 410 for comparison therewith. This generates a digital value on a digital output 412, which represents the error or the difference between the analog voltage levels on the analog lines 406 and 410. This error is input to a digital compensator 416 which is operable to compensate for phase lead due to the operation of an overall buck converter. This provides an output to a digital pulse width modulator 418 which is operable to generate the pulses necessary to control switches in a buck converter 420, one example of which was described in FIG. 2. In general, the digital pulse width modulator 418 will generate multiple pulses for controlling the switches over a single conversion cycle. This conversion cycle can have a length of approximately 2.5 microseconds, such that all switches in the buck converter 420 will be exercised during that period of time and current transferred from the DC-input to the load. The digital pulse modulator 418 is operable to have associated therewith a plurality of state machines that define the plurality of switch driving signals and the timing associated therewith, to allow the first pulse to be generated and then subsequent pulses to be delayed therefrom with their respective pulse widths defined. These state machines, as will be described herein below, allow a particular switching cycle to be facilitated with the defined pulse widths. As will be described in more detail herein below, the digital pulse width modulator 418 utilizes a reference clock generator at one frequency, 25 MHz in one embodiment, and then generates a higher resolution edge therefrom to in effect provide a resolution associated with a much higher clock on the order of 1 GHz. Then the output of the buck converter 420 is output back to the input of the ADC 408 through an anti-aliasing filter 422 in order to provide a filtered feedback analog signal on the analog line 410.

Referring now to FIG. 5, there is illustrated a block diagram of a portion of the digital pulse width modulator for generating the first phase, φ1. The external clock (not shown) generates, in this embodiment, a 25 MHz output clock on a line 502 for input to one input of a phase-frequency detector 504. The phase-frequency detector 504 compares the difference between the input clock signal on line 502, the reference clock, with a feedback signal on a line 506. The output provides a phase-frequency error on error line 510, which is input to a loop filter 512 for output to voltage/current converter 514. Thus, the output of the loop filter 512 provides a voltage which is then converted to a current, this being output on a line 516.

The output 516 is input to a delay block 518 comprised of a plurality of series connected delay elements 520. There are "n" of these delay elements 520. Each of the delay elements 520 is operable to be controlled by the current output on line 516, such that the delay through each of the elements 520 is proportional to the current on line 516. As such, each of the delay elements 520 can be individually controlled to define the delay there through. The delay elements 520 are configured in a "ring oscillator" configuration wherein the output of the last of the delay elements 520 is fed back to the input of the first of the delay elements 520. Each of the delay elements 520 comprises a differential input/output inverter, which is illustrated as providing both the inverted and non-inverted outputs and the non-inverted and inverted inputs, with the inverted output of each of the delay elements 520 connected to the non-inverted input of the next adjacent delay element 520 and the non-inverted output of each of the delay elements 520 connected to the inverted input of the next adjacent delay element 520. This will provide an inverted delay stream and a non-inverted delay stream. The inverted output of the last of the delay elements 520 is input back to the non-inverted input of the first of the delay elements 520 and the non-inverted output of the last of the delay elements 520 is input to the inverted input of the first of the delay elements 520 stream.

The output of the ring oscillator is provided on feedback line 506. The phase-frequency detector 504, loop filter 512, voltage/current converter 514 and the delay block 518 in the form of the ring oscillator provide a delay lock loop (DLL). This is a conventional circuit element. In operation, the delays of the delay elements 520 are adjusted such that the frequency of the delay lock loop with the ring oscillator is set to the frequency of the input reference clock. There is no divider provided and, therefore, there will be a 1:1 correspondence between the two frequencies. In order to provide a higher clock resolution, the output of each of the delay elements 520, both for the inverted and non-inverted outputs, are input to the "n" inputs of an n-input multiplexer 526. The multiplexer 526 is operable to receive a multiplexer control input on a digital input 528, which constitutes the LSB portion of the pulse width control, as will be described herein below. The multiplexer 526 is operable to select one of the outputs of one of the delay elements 520 as a clock edge to define the trailing edge of the pulse. Thus, if the 25 MHz input clock, in this embodiment, provided a 40 ns period, it is possible with the use of twenty delay elements 520 to provide a 1 ns output resolution, representing the resolution associated with the 1 GHz clock. To facilitate this, the node 506 initiates the pulse width by raising the pulse output for φ$_1$ high, which occurs on a line 530 from the output of a set/reset flip-flop 532. The SYNCH signal is input to the set input thereof. Therefore, when the node 506 goes high, φ$_1$ goes high on line 530. The determination then will be when does the pulse go low. This is determined by a reset input received on a line 534. This is connected to the output of a gate 536 which is connected on one input thereof to the output of multiplexer 526. In some situations, the pulse width of φ$_1$ may be greater than 40 ns, the period of the 25 MHz clock. In this event, it will be necessary to count a predetermined number of the 25 MHz clock cycles and then count a predetermined number of the clock edges provided on the output of the ring oscillator and the delay elements 520 with the use of the multiplexer 526. Thus, there will be a course tuning and a fine tuning. The course tuning is provided by an MSB portion, which defines the number of clock cycles of the 25 MHz clock to count from a initial reset SYNCH signal that indicates the beginning of φ$_1$. A counter 538 is provided that is reset by the SYNCH signal and counts the clock edges of the 25 MHz clock on the output of the ring oscillator node 506. The output of the counter is input to a digital comparator 540, which also receives on another input thereof an MSB value. When the counter 538 counts up to the value of MSB, the output of the comparator 540 will be true and is input on a line 544 to the other input of the gate 536. When the output of the comparator 540 is true, it is only then necessary to determine which of the outputs of the delay elements 520 is to be selected by the LSB value. When this occurs, the output of the multiplexer on a line 546 will go high, thus raising the output on line 534 high and generating a reset, thus causing the output of φ$_1$ to go low. It can then be seen that the resolution provided by the delay elements 520 provides a 1/40 divide ratio over the period of the 25 MHz clock. It is noted that there is no clock required for a counter operating at the 1 GHz rate to provide the 1 ns resolution; rather, it is only the delay elements that are required. This therefore provides a "pseudo high frequency clock."

Referring now to FIGS. 6a and 6b, there are illustrated a simplified block diagram of the ring oscillator and associated timing diagrams, respectively. In FIG. 6a, there are illustrated three delay elements 602, 604 and 606 by way of example, connected in series such that the output of delay element 606, an inverter, is input back into the input of delay element 602, also an inverter. The output of delay element 602 is input to the input of delay element 604, also an inverter, the output of which is input to the input of the delay element 606. Each of the delay elements 606 is controlled by a I$_{CONTROL}$ signal on a line 608, this being the current that would be output by the voltage/current converter 514. The output of the inverter 602 is inverted through an inverter 610 for illustrative purposes to provide an output "B." The output of delay element 604 provide an output "C" and the output of the inverter 606 provides an output "A."

Referring specifically to FIG. 6b, the timing diagram for the operation of the ring oscillator of FIG. 6a are illustrated. The output signal "A" goes high at an edge 612. This will cause the output of delay element 602 to go low and the output of converter 610 to go high at an edge 614 with a delay "d$_1$." The output of delay element 602 will drive the input of delay element 604, the output thereof going high at an edge 616 after delay "d$_2$." The edge 616 is input to the input delay element 606 which will cause the output thereof to go low at an edge 618 after a delay "d$_3$." It is noted that each of the delays are identical and that there will be required three delays between edge 612 and edge 618. These delays are adjusted such that the delays are set for a given frequency, i.e., they will divide the period of the reference clock by a predetermined number of delays, three in this embodiment, and will be set. With the delay lock loop, the frequency of the ring oscillator is locked to the frequency of the reference clock, which is a stable clock, typically crystal controlled, and the delay elements are all substantially identical.

Figure 7:
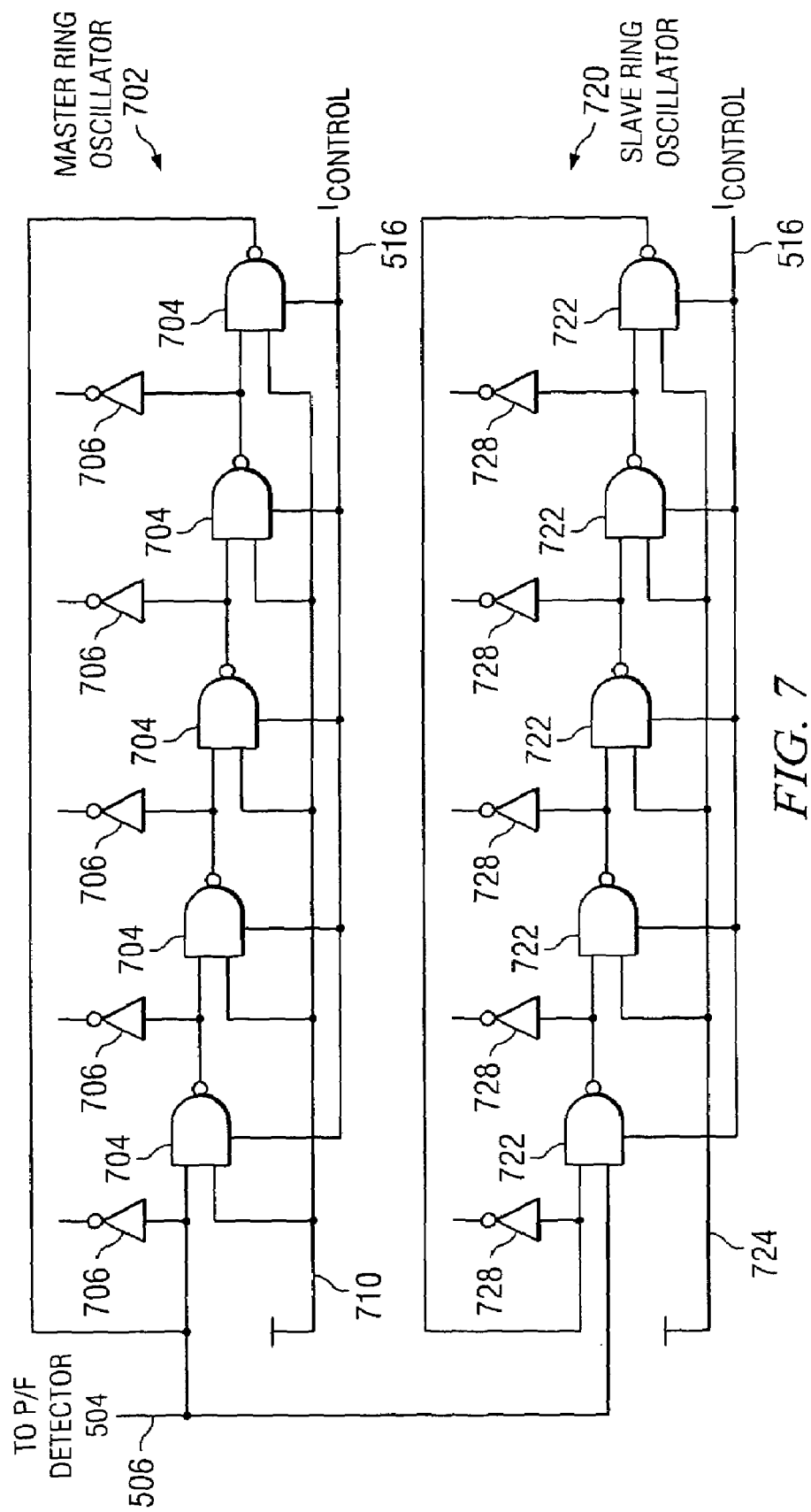
FIG. 7 illustrates a detailed timing diagram for triggering a second phase from the falling edge of a preceding phase.

Referring now to FIG. 7, there is illustrated a more detailed block diagram of the ring oscillator 518 illustrating a master/slave configuration. This configuration is illustrated as a master ring oscillator 702, which is comprised of a plurality of two-input NAND gates 704 connected in series such that the output of each of the NAND gates is input to one input of the next successive NAND gate 704 in the ring, such that the first NAND gate 704 has the one input thereof connected to the output of the last NAND gate 704 in the string. In this illustration of FIG. 7, there are illustrated only five NAND gates 704, it being understood that at least 40 NAND gates 704 would be required to obtain the resolution of 1 GHz from a 25 MHz primary clock. This was described herein above. The output of each of the NAND gates 704 has associated therewith an inverter buffer 706 for providing an output to the input of a multiplexer (not shown) that is similar to the multiplexer 526 of FIG. 5. The other input of each of a NAND gates 704 is connected to $V_{DD}$ on a line 710 and each of the NAND gates 704 has the delay there through controlled by the $I_{CONTROL}$ signal on line 516.

A slave oscillator 720 is provided which is comprised of a plurality of two-input NAND gates 722 substantially identical to the NAND gates 704 in both number and construction and connected in series as a ring oscillator, this slave ring oscillator 720 being identical to the master ring oscillator 702. However, the second inputs of the second through the last NAND gates 722 are connected to $V_{DD}$ on line 724, but the second input of the first NAND gate 722 is connected to line 506, which is the feedback path around the NAND gates 704 in the master ring oscillator 702. This essentially constitutes the output of the ring oscillator 702 and the input to the phase/frequency detector 504. Thus, it can be seen that the slave ring oscillator 720 will be gated on at the rising edge of the clock signal on the line 506 and, therefore, will be phase aligned or synchronized with the master ring oscillator, but it will be a slave oscillator. As was the case with the master ring oscillator 702, each of the NAND gates 722 has a delay thereto controlled by the common $I_{CONTROL}$ signal on line 516 and each has the output thereof connected through an associated inverter buffer 728 to the input of a multiplexer (not shown) similar to the multiplexer 526 and associated with subsequent phases, as will be described herein below.

Referring now to FIG. 8, there is illustrated a more detailed diagram of the NAND gates 704 and 722 in association with the voltage/current converter 514 and the loop filter 512. The loop filter 512 is comprised of a first capacitor 802 connected between a node 804 that provides the voltage control signal, $V_{CONTROL}$ that provides control voltage for the overall delay locked loop. The capacitor 802 is connected between node 804 and ground. A resistor 806 is connected between node 804 and one side of a capacitor 808, the other side of the capacitor 808 connected to ground. The capacitors 802 and 808 and resistor 806 basically provide a low pass filter, this being a conventional loop filter operation. A charge pump 810 is provided for driving the node 804 from the phase/frequency detector 504.

The node 804 drives the voltage/current converter 514. This is comprised of an input amplifier 812, which has the positive input thereof connected to the $V_{CONTROL}$ signal on node 804 and the output thereof driving an n-channel transistor 814, wherein the source/drain path thereof is connected between a node 816 and a node 818. The negative input of the amplifier 812 is connected to node 818. Thus, the amplifier 812 and transistor 814 are connected in a voltage follower configuration. Node 818 drives one side of a resistor 820, the other side thereof connected to ground. The value of the resistor is equal to $1/g_m$, $g_m$ being the gain of amplifier 812. A p-channel transistor 824 has the source/drain path thereof connected between $V_{DD}$ and node 816 and the gate thereof connected to node 816. Therefore, the voltage on node 814 is converted to a current, $I_{CONTROL}$, through transistor 814. This is mirrored from node 816 over to a p-channel transistor 830. Transistor 830 has the gate thereof connected to node 816 and the source/drain path thereof connected between $V_{DD}$ and a node 832. Node 832 is connected to one side of two series connected complimentary transistors, a p-channel transistor 834 and an n-channel transistor 836, wherein transistor 832 has the source/drain path thereof connected to a node 832 and output node 838 and transistor 836 has the source/drain path thereof connected to the output node 838 and ground. The gates of transistors 834 and 836 are connected to a drive node 840, this being the input. Therefore, it can be seen that this current $I_{CONTROL}$ can be varied in a substantially linear manner as a function of the voltage on node 804. The current through transistors 834 and 836 will define the current that will drive the output node 838 and, therefore, will define the delay through the gate.

Referring now to FIG. 9, there is illustrated a timing diagram for two phases of the switching operation, $\phi_1$ and $\phi_2$, with the pulse width of $\phi_1$ beginning at an edge 902 and then terminating at a falling edge 904. The falling edge 904, as defined herein above, is set by the multiplexer 526 and the counter 538 with the embodiment of FIG. 5. Once the edge 904 goes low, this will then generate a rising edge 906 on a second pulse, the $\phi_2$ pulse. However, there will be a delay provided between the two. Thereafter, the width of the pulse $\phi_2$ will be defined to a falling edge 908. Thus, it is necessary to define the width of the pulse $\phi_1$, the delay between the end of $\phi_1$ and the beginning of $\phi_2$ and then the pulse width of $\phi_2$, with the delay between edge 904 and 906 defined with the resolution of the pseudo high frequency clock that is generated with the output of the delay elements, as will be described herein below. The pulse width of $\phi_2$ between the edges 906 and 908 is also defined such that the edge has a resolution of the smallest delay element, i.e., that of the pseudo high frequency clock.

Referring now to FIG. 10, there is illustrated a block diagram of the state machine for generating the two edges 906 and 908 and providing the delay between edges 904 and 906. A plurality of delay elements 1002 are connected in series similar to the delay elements 520 in FIG. 5, with the exception that they are not configured as a ring oscillator but, rather, as an in-line delay block. The inverted and non-inverted outputs of each of the delay elements are input to associated inputs of a multiplexer 1004, which is controlled by an LSB on an input 1006. The output of multiplexer 1004 selects between the available outputs of the delay elements 1002, in accordance with the operation described herein above with respect to FIG. 5 and multiplexer 526. The input of the first of the delay elements 1002 is driven by the $\phi_1$ pulse on the output line 530, such that the rising edge thereof will be delayed through each of delay elements 1002 and to the multiplexer 1006. By selecting the appropriate output of the appropriate delay element 1002, a fixed delay can be determined. Each of the delay elements 1002 is controlled by the current control signal on line 516 such that the delays in each of the delay elements 1002 are substantially equal to the delays in delay elements 520, and delay elements 1002 are substantially identical thereto. The output of multiplexer 1006 provides a delayed rising edge on a line 1010, which is input to the set input of a set/reset flip-flop 1012. This will cause the output thereof to go high on an output 1014 to provide the output $\phi_2$ and provide the edge 906. However, it is then necessary to define the pulse width between edges 906 and 908. This is facilitated with the use of a second and slave ring oscillator 1016 that is slaved to the ring oscillator associated with the DLL described herein above with respect to FIGS. 5 and 7. The ring oscillator 1016 is synchronized or phase aligned with the output of the multiplexer 546, as the output of the multiplexer 546 will provide a clock edge that is synchronized or phase aligned with the 25 MHz clock, but is delayed from one edge thereof and is synchronized or phase aligned with the falling edge 904 of the $\phi_1$ pulse. There are a number of ways to provide the synchronization or phase alignment.

A slave oscillator 1016 is provided that receives the $I_{Control}$ signal on the line 516 to provide the associated outputs to a multiplexer 1018, similar to multiplexer 526. An LSB input thereof selects the LSB associated therewith for output on a line 1022. In order to provide the MSB portion thereof, a counter 1026 is provided that is initially reset by the output of multiplexer 1004 and then incremented by the master output of the ring oscillator 702, the output of which drives one input of a digital comparator 1028, the other input thereof connected to an MSB input defining the compare value. The output of comparator 1028 and the signal on line 1022 are both input to separate inputs of a two input gate 1024, the output thereof driving the reset input of a flip-flop 1012. Therefore, the counter 1026 will count a predetermined number of clock cycles of the 25 MHz clock, which are output from the ring oscillator 702 and this will be summed with the output of the multiplexer 1018 to further refine the falling edge to the frequency of the pseudo clock. This will be described in more detail herein below.

Referring now to FIGS. 11a–11c, there are illustrated timing diagrams as to how both the delay between two successive pulses and the pulse width of the subsequent pulse are defined. This relates to the description of the $\phi_2$ state machine of FIG. 10. Specifically referring to FIG. 11a, there are illustrated a detail of two pulses, $\phi_1$ and $\phi_2$ by way of illustration. The edge of $\phi_1$ is generated directly off the output of the master ring oscillator to provide a rising edge 1102. The MSB, MSB1, will define the number of clock edges of the master 25 MHz clock that will be counted up to a point 1104, after which a portion of one cycle of the 25 MHz clock needs to be determined by the LSB, this being defined in this example as LSB1. This will result in a falling edge 1106 on $\phi_1$. This, as noted herein above, will cause $\phi_2$ to go high at a rising edge 1108 after a delay, D1. Thereafter, the pulse width of $\phi_2$ must be determined between the rising edge 1108 and a falling edge 1110. This is also defined in terms of an MSB, MSB2, and an LSB, LSB2. Therefore, the pulse width between edges 1108 and 1110 will be defined as a function of a discrete number of the master clock cycles of the 25 MHz clock and one of the clock edges from the associated multiplexer, this being defined by LSB2. However, a problem occurs in that the edge 1108 does not occur on an edge of the master clock. This is due to the fact that the sum of LSB1 and D1 may not coincide with an edge of the master clock.

Specifically referring to FIG. 11b, the timing diagram or a detail of the edges is illustrated for $\phi_1$ and $\phi_2$. In this example, it is noted that, at point 1104, the distance to edge 1106 is ⅟₃₀ of a clock cycle such that the output of the 30$^{th}$ delay element will be selected. The value of D1 is set to equal five cycles of the pseudo-clock to reach edge 1108. The pulse width of $\phi_2$ between edge 1108 and edge 1110 is set such that the LSB will be equal to ten. The problem is that the distance between 1104, the last occurring edge of the master clock and edge 1108 is less than a master clock cycle, it being equal to 35 cycles of the pseudo high frequency clock. Therefore, the actual clock edge of the high frequency clock will not occur until a point 1112, which is five cycles of the high frequency clock from edge 1108. As such, all that is necessary is to initiate the counter 1026 on the master clock edge 1112 and subtract the distance between the number of high frequency clock cycles between edge 1108 and the next occurring high frequency clock edge 1112 from LSB2. This will result in an offset LSB2 by a factor of five. For an LSB of ten, this will result in an LSB of five from the last counted MSB at a point 1114 to the edge 1110. In this manner, the entire LSB of ten can be added to the MSB count to provide the entire pulse width of $\phi_2$. This, as noted herein above, is merely one example of determining the pulse width $\phi_2$. This is a relative determination from the edge 1106, whereas an absolute determination could be made from the edge 1102.

Specifically referring now to FIG. 11c, there is illustrated a detail of this offset. The ring oscillator 1016 will provide the output to the multiplexer 1018. The $\phi$1 falling edge occurs at the 30$^{th}$ delay element to account fro an LSB of 30 and the rising edge 1108 of $\phi_2$ occurs five clock cycles of the pseudo high frequency clock later at the 35$^{th}$ clock cycle of the pseudo high frequency clock. Thereafter, there will have to be ten additional cycles of the pseudo high frequency clock to account for LSB2. This will result in a wraparound of the ring oscillator 1016, such that the $\phi_2$ falling edge can occur at the fifth output of the multiplexer 1018.

Figure 12:
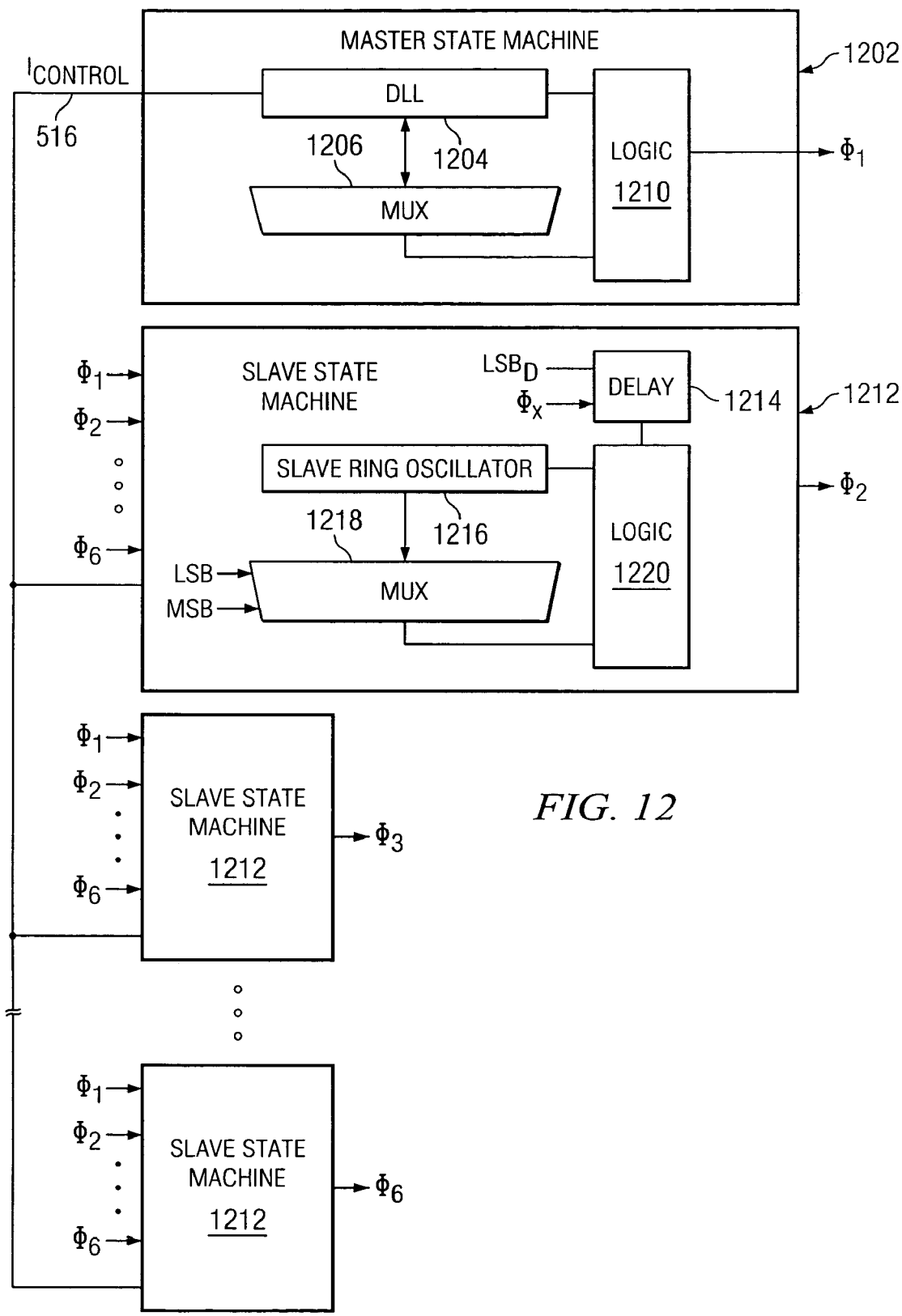
FIG. 12 illustrates a block diagram of the state machine associated with each of the switch phases.

Referring now to FIG. 12, there is illustrated a block diagram of the state machine associated with each of the phases. As noted herein above, a first state machine 1202 is provided for $\phi_1$. This utilizes a master oscillator/DLL 1204 that drives a multiplexer 1206 with a plurality of outputs that can be selected. The output of the DLL 1204 and multiplexer 1206 are input to logic circuitry 1210 to provide the output $\phi_1$, as described herein above. The DLL 1204 will determine the $I_{CONTROL}$ signal on a line 516. A plurality of additional slave state machines 1212 are provided for each of the remaining phases $\phi_2$, $\phi_3$, $\phi_4$, $\phi_5$ and $\phi_6$. Each of the slave state machines is described herein above with respect to FIG. 10 and includes a delay block 1214, a slave ring oscillator 1216, and a multiplexer 1218, which are all combined with a logic block 1220 to provide the respective phase outputs. Each of the slave state machines receives all of the phase inputs from the other state machines, such that the delay block 1214 can be configured to select the appropriate data output. All that is required then is to provide the correct LSB values and MSB values to the delay block 1214 and multiplexer block 1218.

Although the preferred embodiment has been described in detail, it should be understood that various changes, substitutions and alterations can be made therein without departing from the spirit and scope of the invention as defined by the appended claims.

What is claimed is:

1. A timing source for a pulse generator, comprising:
   an input for receiving a reference clock output at a reference operating frequency;
   a pulse reference edge input for receiving a pulse reference edge for a single pulse;
   an edge generator for generating a plurality of clock edges from an edge of said reference clock during one period thereof, with the spacing of said plurality of clock edges being a multiple of a predetermined divisor, such that the resolution of such spacing emulates a higher clock frequency than said reference operating frequency; and
   a selector for selecting one of said plurality of clock edges relative to said pulse reference edge to define the width of said single pulse;
   wherein the width of said single pulse is equal to or greater than a single period of said reference clock.

2. The timing source of claim 1, wherein said edge generator includes a delay block having a plurality of discrete delay elements therein connected in a chain, each for generating a delayed representation of said reference clock, wherein the smallest delay defines the highest resolution.

3. The timing source of claim 2, wherein each of said discrete delay elements has substantially the same delay.

4. The timing source of claim 1, wherein said edge generator includes a delay lock loop comprising:
   a ring oscillator comprised of a plurality of series connected variable delay elements in a feedback loop, each having a discrete delay associated therewith;
   an error detector for detecting the error between said reference clock and the output of said ring oscillator; and
   a loop controller for varying the delay of said variable delay elements to minimize the error detected by said error detector, such that the frequency of said ring oscillator is locked to the frequency of said reference clock;
   wherein each of said delay elements outputs clock edges that are separated by the delay of said associated delay element.

5. The timing source of claim 4, wherein each of said variable delay elements has substantially the same delay.

6. The timing source of claim 4, wherein said selector comprises an edge selector for selecting the output of one of said variable delay elements based upon a pulse width control signal that defines the pulse width of the pulse as the integral number of said discrete delays between an edge of the output of said ring oscillator and the generation said selected edge.

7. The timing source of claim 6, wherein there are n of said variable delay elements and said edge selector comprises a n-input multiplexer for selecting the output of one of said variable delay elements.

8. The timing source of claim 6, and further comprising a counter on the output of said edge selector for counting a predetermined number of said selected edges.

9. A timing source for a pulse generator, comprising:
   an input for receiving a reference clock output at a reference operating frequency;
   an edge generator for generating a plurality of clock edges from an edge of said reference clock during one period thereof, with the spacing of said plurality of clock edges being a multiple of a predetermined divisor, such that the resolution of such spacing emulates a higher clock frequency than said reference operating frequency; and
   a selector for selecting one of said plurality of clock edges from a reference one thereof to define the width of a pulse, wherein said selector further includes a counter for counting a predetermined number of clock cycles of said reference clock signal and a summer for summing the time associated with said predetermined number of clock cycles of said reference clock signal to define said pulse width.

10. A timing source for a pulse generator, comprising:
    an input for receiving a reference clock output at a reference operating frequency;
    an edge generator for generating a plurality of clock edges from an edge of said reference clock during one period thereof, with the spacing of said plurality of clock edges being a multiple of a predetermined divisor, such that the resolution of such spacing emulates a higher clock frequency than said reference operating frequency; and
    a selector for selecting one of said plurality of clock edges from a reference one thereof to define the width of a pulse, wherein said selector includes an additional timing circuit for increasing the width of the pulse by a predetermined number of the clock cycles of said received reference clock.

11. The timing circuit of claim 10, wherein said selector comprises:
    a counter for counting a predetermined number of the clock cycles of said received reference clock in accordance with a predetermined MSB value to define a first portion of the length of the pulse; and
    a multiplexer for selecting one of said plurality of clock edges from a reference one thereof to define the width of a second portion of the pulse in accordance with a predetermined LSB value, such that the width of the pulse is the sum of the first and second portions.

12. A method for determining the width of a pulse in a pulse generator, comprising the steps of:
    receiving on an input a reference clock output at a reference operating frequency;
    receiving a pulse reference edge input a pulse reference edge for a single pulse;
    generating with an edge generator a plurality of clock edges from an edge of the reference clock during one period thereof, with the spacing of the plurality of clock edges being a multiple of a predetermined divisor, such that the resolution of such spacing emulates a higher clock frequency than the reference operating frequency; and
    selecting with a selector one of the plurality of clock edges relative to the pulse reference edge to define the width of the single pulse;
    wherein the width of the single pulse is equal to or greater than a single period of the reference clock.

13. The method of claim 12, wherein the edge generator includes a delay block having a plurality of discrete delay elements therein connected in a chain, each for generating a delayed representation of the reference clock, wherein the smallest delay defines the highest resolution.

14. The method of claim 13, wherein each of the discrete delay elements has substantially the same delay.

15. The method of claim 12, wherein the step of generating includes the step of providing a delay lock loop that includes the steps of:

connecting a plurality of series connected variable delay elements in a feedback loop, each having a discrete delay associated therewith, to form a ring oscillator;

detecting with an error detector the error between the reference clock and the output of the ring oscillator; and varying the delay of the variable delay elements with a loop control to minimize the error detected by the error detector, such that the frequency of the ring oscillator is locked to the frequency of the reference clock;

wherein each of the delay elements outputs clock edges that are separated by the delay of the associated delay element.

16. The method of claim 15, wherein each of the variable delay elements has substantially the same delay.

17. The method of claim 15, wherein the step of selecting comprises selecting the output of one of the variable delay elements based upon a pulse width control signal that defines the pulse width of the pulse as the integral number of the discrete delays between an edge of the output of the ring oscillator and the generation the selected edge.

18. The method of claim 17, wherein there are n of the variable delay elements and the step of selecting comprises selecting with an n-input multiplexer the output of one of the variable delay elements.

19. The method of claim 17, and further comprising the with a counter on the output of the edge selector a predetermined number of the selected edges.

20. A method for determining the width of a pulse in a pulse generator, comprising the steps of:

receiving on an input a reference clock output at a reference operating frequency;

generating with an edge generator a plurality of clock edges from an edge of the reference clock during one period thereof, with the spacing of the plurality of clock edges being a multiple of a predetermined divisor, such that the resolution of such spacing emulates a higher clock frequency than the reference operating frequency; and selecting with a selector one of the plurality of clock edges from a reference one thereof to define the width of a pulse, wherein the step of counting further includes the step of counting with a counter a predetermined number of clock cycles of the reference clock signal and a summing the time associated with the predetermined number of clock cycles of the reference clock signal to define the pulse width.

21. A method for determining the width of a pulse in a pulse generator, comprising the steps of:

receiving on an input a reference clock output at a reference operating frequency;

generating with an edge generator a plurality of clock edges from an edge of the reference clock during one period thereof, with the spacing of the plurality of clock edges being a multiple of a predetermined divisor, such that the resolution of such spacing emulates a higher clock frequency than the reference operating frequency; and selecting with a selector one of the plurality of clock edges from a reference one thereof to define the width of a pulse, wherein the step of selecting includes increasing the width of the pulse by a predetermined number of the clock cycles of the received reference clock.

22. The method of claim 21, wherein the step of selecting comprises the steps of:

counting with a counter a predetermined number of the clock cycles of the received reference clock in accordance with a predetermined MSB value to define a first portion of the length of the pulse; and selecting with a multiplexer one of the plurality of clock edges from a reference one thereof to define the width of a second portion of the pulse in accordance with a predetermined LSB value, such that the width of the pulse is the sum of the first and second portions.

* * * * *